US012594747B2

(12) United States Patent
Torres et al.

(10) Patent No.: US 12,594,747 B2
(45) Date of Patent: Apr. 7, 2026

(54) BEZELS FOR FOLDABLE DISPLAYS

(71) Applicant: Dell Products, L.P., Round Rock, TX (US)

(72) Inventors: Christopher A. Torres, San Marcos, TX (US); Enoch Chen, Taipei City (TW)

(73) Assignee: Dell Products L.P., Round Rock, TX (US)

( * ) Notice: Subject to any disclaimer, the term of this patent is extended or adjusted under 35 U.S.C. 154(b) by 568 days.

(21) Appl. No.: 17/376,491

(22) Filed: Jul. 15, 2021

(65) Prior Publication Data

US 2023/0012951 A1     Jan. 19, 2023

(51) Int. Cl.
 *B32B 27/06* (2006.01)
 *B32B 7/12* (2006.01)
  (Continued)

(52) U.S. Cl.
 CPC .............. *B32B 27/065* (2013.01); *B32B 7/12* (2013.01); *B32B 27/08* (2013.01); *B32B 27/365* (2013.01); *B32B 27/40* (2013.01); *B32B 37/12* (2013.01); *B32B 38/10* (2013.01); *G06F 1/1616* (2013.01); *G06F 1/1652* (2013.01); *G06F 1/1686* (2013.01); *G09G 3/3208* (2013.01); *H05K 5/0017* (2013.01); *H05K 5/0217* (2013.01); *B32B 2266/0278* (2013.01);
  (Continued)

(58) Field of Classification Search
 CPC ......... B32B 27/065; B32B 7/12; B32B 27/08; B32B 27/365; B32B 27/40; B32B 37/12; B32B 38/10; B32B 2266/0278; B32B 2307/412; B32B 2457/20; B32B 3/08;

B32B 5/18; B32B 27/36; G06F 1/1616; G06F 1/1652; G06F 1/1686; G09G 3/3208; G09G 2380/02; H05K 5/0017; H05K 5/0217

See application file for complete search history.

(56) References Cited

U.S. PATENT DOCUMENTS

2016/0048167 A1* 2/2016 Aurongzeb ........... G06F 1/1694
                                                          361/679.26
2020/0401187 A1* 12/2020 Noh ....................... G06F 1/1684
2021/0064092 A1* 3/2021 Kwon ..................... G06F 1/189

OTHER PUBLICATIONS

English translation for Gong et al (CN 111833751 A) (Year: 2020).*

* cited by examiner

*Primary Examiner* — Nathan L Van Sell
(74) *Attorney, Agent, or Firm* — Fogarty LLP

(57) ABSTRACT

A multi-layer bezel for a flexible information handling system (IHS) display may include a die-cut polycarbonate rectangular frame layer, a die cut low durometer foam layer, aligned with and disposed below the polycarbonate rectangular frame layer and a polymer layer aligned with the polycarbonate rectangular frame layer. In various implementations the rectangular frame layer may have a first open-sided rectangular frame segment and a complementary second open-sided rectangular frame segment. The die-cut polycarbonate may be transparent and back-printed with sensor openings for IHS components. The bezel may be a multi-layer stack-up that is die cut to define the bezel. Alternatively, the bezel may be defined by a domed polyurethane upper layer disposed on the die cut polycarbonate rectangular frame layer on a side of the polycarbonate rectangular frame layer opposite the die cut low durometer foam layer.

17 Claims, 8 Drawing Sheets

(51) Int. Cl.

| | |
|---|---|
| *B32B 27/08* | (2006.01) |
| *B32B 27/36* | (2006.01) |
| *B32B 27/40* | (2006.01) |
| *B32B 37/12* | (2006.01) |
| *B32B 38/10* | (2006.01) |
| *G06F 1/16* | (2006.01) |
| *G09G 3/3208* | (2016.01) |
| *H05K 5/00* | (2025.01) |
| *H05K 5/02* | (2006.01) |

(52) U.S. Cl.
     CPC ..... *B32B 2307/412* (2013.01); *B32B 2457/20*
     (2013.01); *G09G 2380/02* (2013.01)

602

600

700

702

106

106

BEZELS FOR FOLDABLE DISPLAYS

FIELD

The present disclosure relates generally to Information Handling Systems (IHSs), and more particularly, to bezels for foldable displays.

BACKGROUND

As the value and use of information continue to increase, individuals and businesses seek additional ways to process and store it. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

SUMMARY

Embodiments of systems and methods for bezels for foldable displays are described. In an illustrative, non-limiting embodiment, a multi-layer bezel for a flexible information handling system (IHS) display may include a die-cut polycarbonate rectangular frame layer, a die cut low durometer foam layer, aligned with and disposed below the polycarbonate rectangular frame layer and a polymer layer aligned with the polycarbonate rectangular frame layer. In various implementations the rectangular frame layer may have a first open-sided rectangular frame segment and a complementary second open-sided rectangular frame segment. The die-cut polycarbonate may be transparent and back-printed with sensor openings for IHS components, such as a camera, ambient light sensor, light emitting diode, infrared/facial recognition camera, microphone(s), hall sensor, and/or the like.

In some implementations the bezel is a multi-layer stack-up of a first bezel stack-up layer comprising the polycarbonate layer, which includes two thin transparent polycarbonate sheets and an elastomer strip disposed between an edge of each of each of the polycarbonate sheets. A second bezel stack-up layer comprises the polymer layer, as a thin film polyester thermoplastic polymer sheet layer adhered to the polycarbonate sheets and the elastomer strip. A third bezel stack-up layer comprises the low durometer foam layer, as an inner, low durometer, polyurethane foam sheet and an outer pressure sensitive adhesive border. This multi-layer stack-up is die cut to define the bezel for the flexible display, and may be machine finished to provide chamfers along inner and outer perimeters. In such implementations the transparent polycarbonate provides structural rigidity to the bezel and may be back-printed. The elastomer strip may be disposed between the edge of each of each of the polycarbonate sheets. The elastomer strip may be a synthetic rubber strip, such as silicon foam rubber strip and may be disposed between the edge of each of each of the polycarbonate sheets. The elastomer strip may have a fine texture defined in a top surface of the elastomer strip. Alternatively, or additionally the elastomer strip may be a composite elastomer strip comprising a central strip of higher durometer rigid elastomer and strips of lower durometer elastomer foam on either side of the central strip of higher durometer rigid elastomer. Also, the outer pressure sensitive adhesive border may be a stretch to release pressure sensitive adhesive.

In other implementations the polymer layer aligned with the polycarbonate rectangular frame layer is a domed polyurethane upper layer disposed on the polycarbonate rectangular frame layer on a side of the polycarbonate rectangular frame layer opposite the die cut low durometer foam layer, aligned with the polycarbonate rectangular frame layer.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Systems and methods are described for bezels for foldable displays used in Information Handling Systems (IHSs). As used herein, the terms foldable display is used to generally refer to an electronic visual display that is flexible in nature, as opposed to traditional flat screen displays with a front panel made of glass. Examples of foldable displays include, but are not limited to: electronic ink, organic liquid-crystal display (LCD), organic light-emitting diode (OLED) displays, etc.

Various system integration challenges arise in IHSs employing flexible display not normally found in traditional IHSs. For example, integration of key components (e.g., Camera, Sensor, Antenna, etc.) around a perimeter of the flexible display panel, protecting these components and the panel module together, as well as providing an aesthetically appealing bridge between the IHS's housing and the panel's border.

Embodiments of the present systems and methods cover, protect, and even help align key components (e.g., a camera module) and the panel module, while providing flexure in the folding region to ensure correct bending behavior. In accordance with embodiments of the present systems and methods, a multi-layer bezel for a flexible information handling system (IHS) display may include a die-cut polycarbonate rectangular frame layer, a die cut low durometer foam layer, aligned with and disposed below the polycarbonate rectangular frame layer and a polymer layer aligned with the polycarbonate rectangular frame layer. In various implementations the rectangular frame layer may have a first open-sided rectangular frame segment and a complementary second open-sided rectangular frame segment. The die-cut polycarbonate may be transparent and back-printed with sensor openings for IHS components.

Accordingly, using systems and methods described herein, an IHS (e.g., a handheld device, laptop, etc.) with a foldable display, where two portions of the foldable display are fixed (i.e., without translation of the sides of the display), may be allowed to rotate from closed (e.g., 0° degrees) to open or flat (e.g., 180° degrees), so as to provide an inside folding configuration. These systems and methods may facilitate such rotation and may enable the display to move in a controlled fashion, around its folding region. For example, in accordance with embodiments of the present systems and methods an IHS flexible display bezel may be provided by adhering a die cut low durometer foam layer, aligned with and disposed below a polycarbonate rectangular bezel frame layer, to the polycarbonate rectangular bezel frame layer, disposing a polymer layer aligned with the polycarbonate rectangular frame layer, and adhering a resulting multi-layer bezel to the flexible display.

Figures 1, 2:
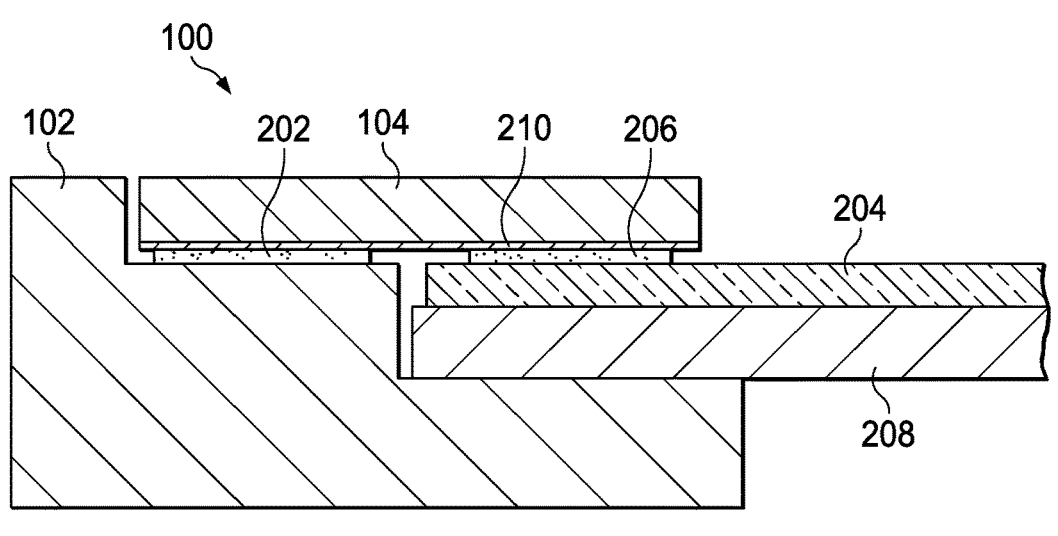
FIG. 1 is a diagrammatic view off a multi-layer bezel for a foldable IHS display, according to some embodiments.
FIG. 2 is a fragmented, generally cross-sectional diagrammatic view of the multi-layer bezel of FIG. 1 showing aspects of integration of the bezel into a foldable IHS display, according to some embodiments.

FIG. 1 is a diagrammatic view off multi-layer bezel 100 for a foldable IHS display, according to some embodiments, whereas FIG. 2 is a fragmented, generally cross-sectional diagrammatic view of multi-layer bezel 100 of FIG. 1 showing aspects of integration of bezel 100 into a foldable IHS display, according to some embodiments. Multi-layer bezel 100 may be shown disposed in conjunction with (i.e., mounted to) middle ring 102 of a foldable IHS display. In accordance with the embodiment shown in FIGS. 1 and 2 bezel 100 may comprise die-cut polycarbonate rectilinear rectangular frame layer (i.e., a frame layer comprising a rectangular frame) 104. As also shown in FIGS. 1 and 2 rectangular frame layer 104 may be made up of first open-sided rectangular frame segment 106 and a coplanar reflective, corresponding complementary second open-sided rectangular frame segment 108. Elastomer (a polymer with viscoelasticity) strips 110 and 112 of flexible material, such as a synthetic rubber strip (e.g., a silicon foam rubber strip), are disposed between edges 114 and 116, and 118 and 120, of each of each of frame segments 106 and 108, respectively. Bezel 100 may be secured to middle ring 102 by outer tape layer 202 and secured and sealed against foldable IHS display panel 204 by inner foam layer 206 with display panel 204 supported by IHS setframe 208. In accordance with the embodiment shown in FIGS. 1 and 2 bezel 100 may comprise die-cut polycarbonate rectilinear rectangular frame layer (i.e., a frame layer comprising a rectangular frame) 104, die cut low durometer foam layer 206, aligned with and disposed below the polycarbonate rectilinear rectangular frame layer, and polymer layer 210 aligned with polycarbonate rectilinear rectangular frame layer 104. In furtherance hereof, the polycarbonate may be transparent and back-printed with sensor openings for components of the IHS, such as a (front facing) camera, ambient light sensor, light emitting diode (flash), infrared/facial recognition camera, microphone(s), hall sensor, and/or the like).

In accordance with some embodiments of the present systems and methods, an IHS flexible display bezel may be provided by stacking: a first bezel stack-up layer, comprising the above-discussed polycarbonate rectangular frame layer, comprising two thin transparent polycarbonate sheets and at least one elastomer strip disposed between an edge of each of each of the polycarbonate sheets; with a second bezel stack-up layer comprising the above-discussed polymer layer, comprising a thin film polyester thermoplastic polymer sheet layer adhered to the polycarbonate sheets and the elastomer strip; with a third bezel stack-up layer comprising the above-discussed low durometer foam layer, comprising, an inner, low durometer, polyurethane foam sheet and an outer pressure sensitive adhesive border. The resulting multi-layer stack-up is then die cut to define the bezel for the flexible display.

Figure 3:
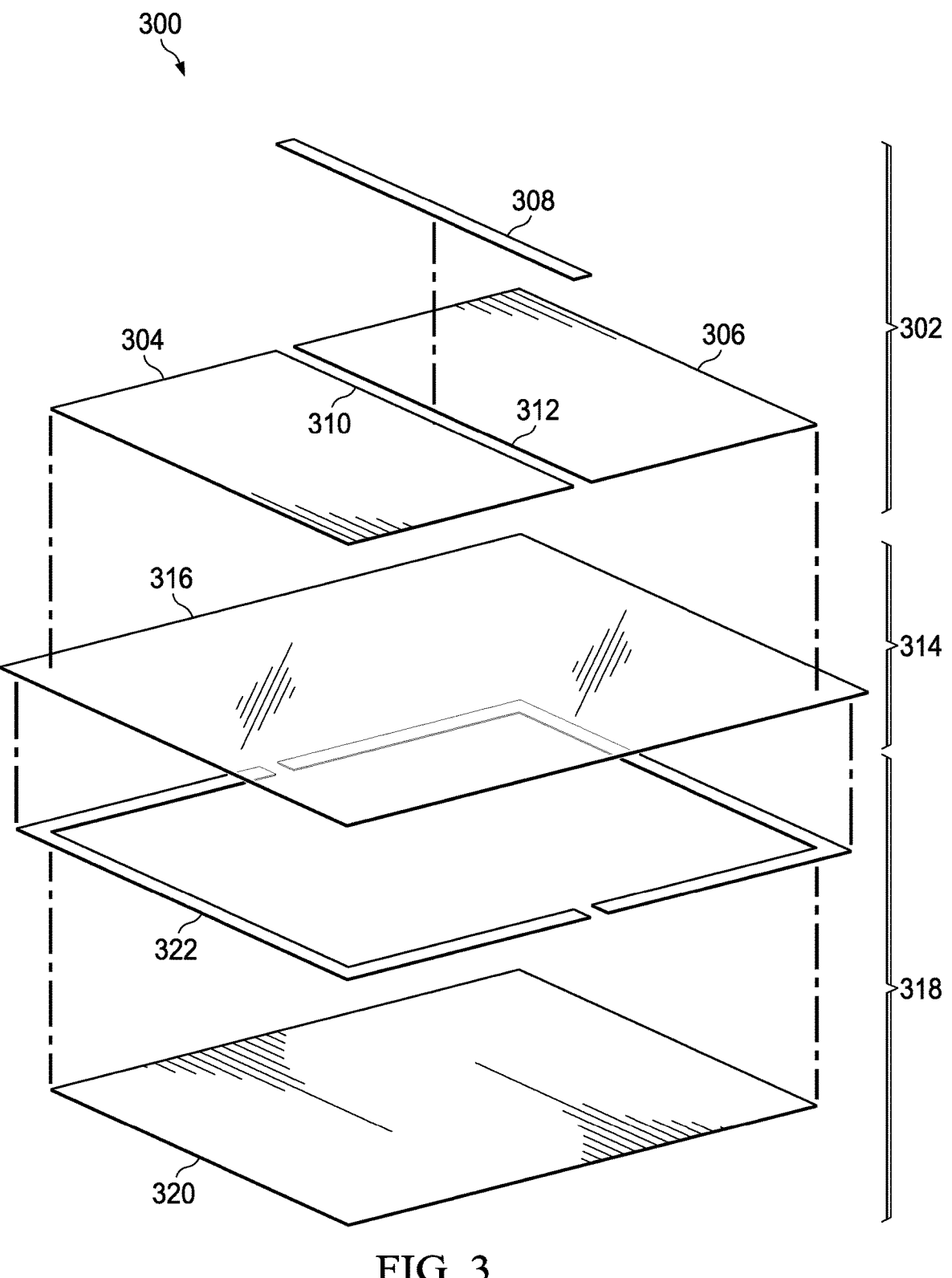
FIG. 3 is a diagrammatic exploded isometric view of a multi-layer stack-up of a multi-layer bezel for a foldable IHS display, according to some embodiments.

FIG. 3 is a diagrammatic exploded isometric view of multi-layer stack-up 300 of a multi-layer bezel for a foldable IHS display, according to some embodiments. Therein, the aforementioned polycarbonate layer is first bezel stack-up layer 302, and may include two thin film transparent polycarbonate sheets (such as, 2 mil (50 micron) LEXAN® FR60, or the like) 304 and 306 disposed edge to edge, spaced apart. In accordance with embodiments of the present systems and methods, this thin-gauge polycarbonate film may be a flame-retardant, clear film with polished surfaces on both sides, with a UL94 V-0 listing, or the like. Elastomer (a polymer with viscoelasticity) strip 308 of flexible material, such as a synthetic rubber strip (e.g., a silicon foam rubber strip), is disposed between edges 310 and 312 of each of each of polycarbonate sheets 304 and 306.

Second bezel stack-up layer 314 provides aforementioned polymer layer 206. Stack-up layer 314 may be a thin film polyester thermoplastic polymer sheet (316), such as a Polyethylene Terephthalate (PET) film, or the like, adhered to polycarbonate sheets 304 and 306 and elastomer strip 308 of first stack-up layer 302. Thereby, thin film polyester thermoplastic polymer sheet 316 acts as the primary carrier to which all of the bezel components are bonded.

Third bezel stack-up layer 318 may be low durometer foam layer, which may include inner, low durometer, polyurethane foam (such as PORON®) sheet 320. This low durometer foam may, in accordance with embodiments of the present systems and methods, act as an inner perimeter gasket to prevent particles from entering into the IHS. This low durometer foam may also help to minimize stress induced into the foldable display panel from the bezel to the panel when folded. Third bezel stack-up layer 318 may further include outer Pressure Sensitive Adhesive (PSA) border 322. This PSA may, in accordance with embodiments of the present systems and methods, attach multi-layer bezel assembly 300 to the IHS, such as IHS middle ring 102, as described above. Outer PSA border 322 may be a stretch-to-release PSA, or the like, which may improve serviceability of a IHS mounting the flexible IHS display, by enabling toolless removal of the bezel to access the IHS display, the aforementioned sensors, etc.

Figure 4:
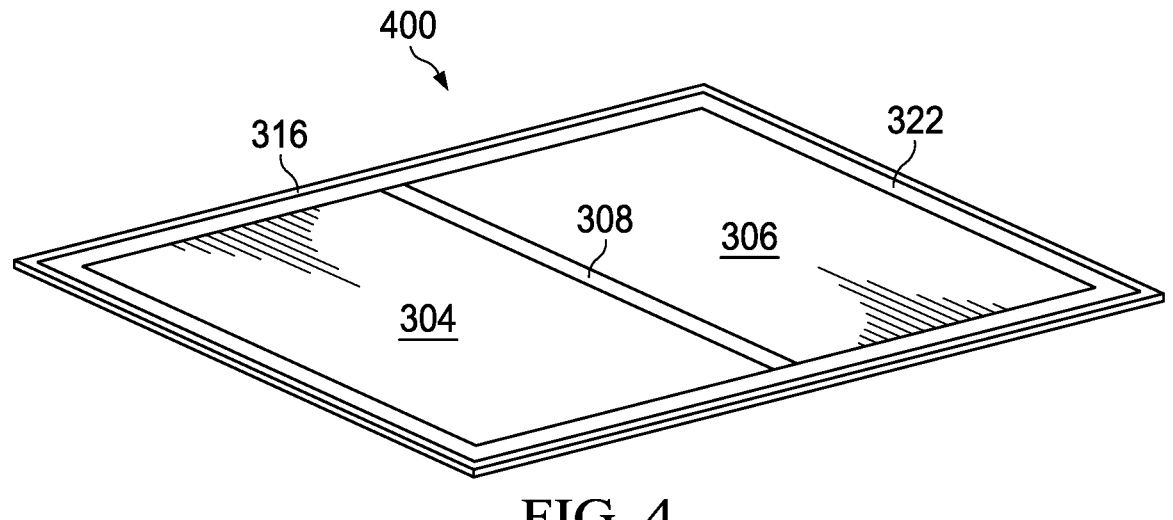
FIG. 4 is a diagrammatic isometric view of a multi-layer stack-up of a multi-layer bezel for a foldable IHS display resulting from the multi-layer stack-up of FIG. 3, according to some embodiments.

FIG. 4 is a diagrammatic isometric view of multi-layer stack-up 400 of a multi-layer bezel for a foldable IHS display resulting from the multi-layer stack-up of FIG. 3, according to some embodiments. In accordance with embodiments of the present systems and methods, resulting multi-layer stack-up 400 is die cut to define a multi-layer bezel for a foldable IHS display. That is, after components 302 through 322 from FIG. 3 are assembled, stack up 400 is die cut to size.

Figure 5:
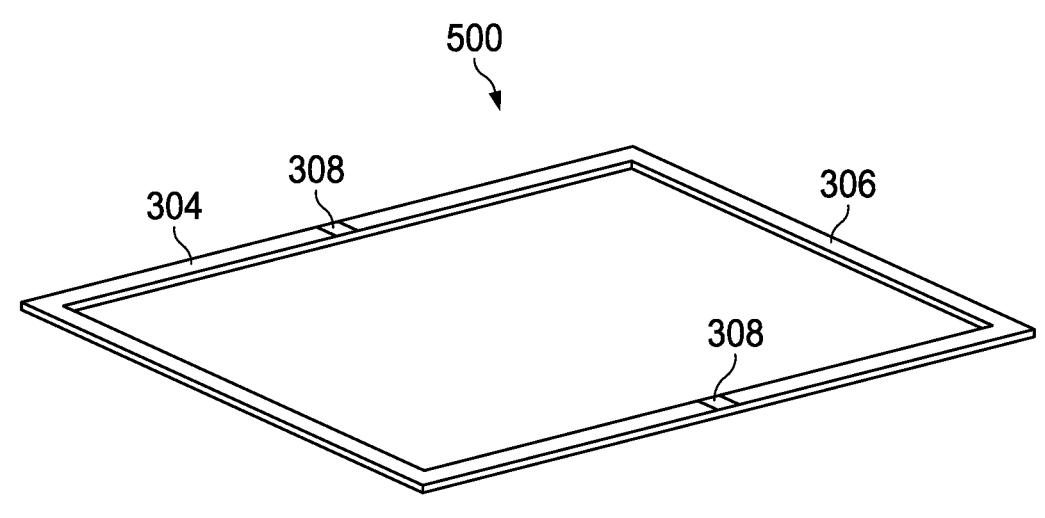
FIG. 5 is a diagrammatic isometric view of a bezel for a foldable IHS display resulting from die cutting of the multi-layer stack-up of FIG. 4, according to some embodiments.
Figure 6:
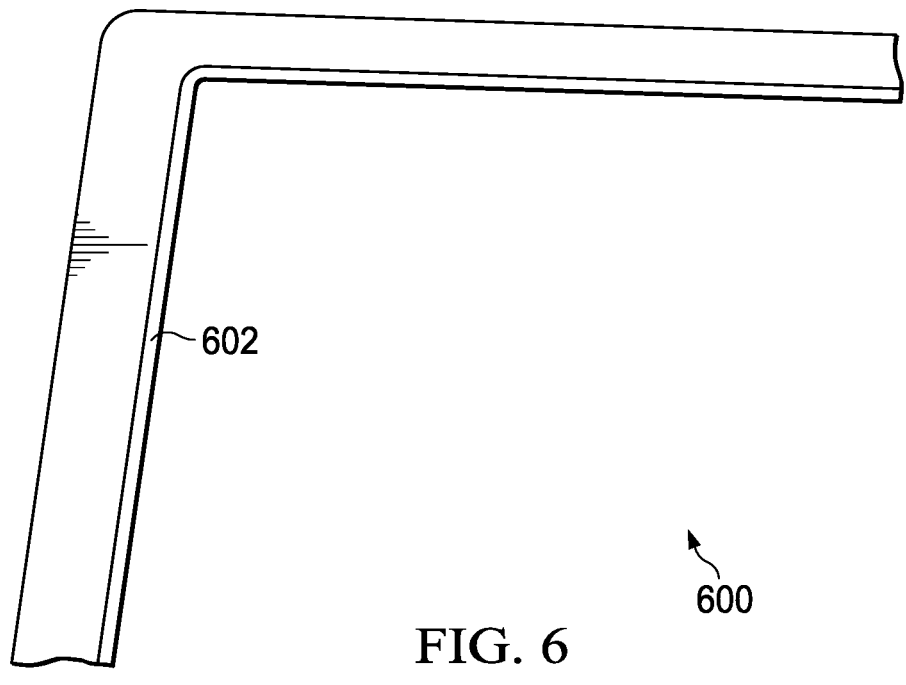
FIG. 6 is a partially fragmented diagrammatic isometric view of a bezel for a foldable IHS display showing inner perimeter chamfers, according to some embodiments.

FIG. 5 is a diagrammatic isometric view of bezel 500 for a foldable IHS display resulting from die cutting of multi-layer stack-up 400 of FIG. 4, according to some embodiments. Resulting bezel 500 is provided structural rigidity by transparent polycarbonate 304 and 306 of first stack-up layer 302, which, as noted above, may be is back-printed, such as with sensor openings for components of the IHS. Inner and outer perimeters of die cut multi-layer stack-up bezel 500 may be machine finished to provide chamfers along the inner and outer perimeters, further define the meets and bounds of the finished bezel for the foldable IHS display, reduce "visual height" of the bezel, foldable IHS display and/or mounting IHS, improve aesthetics of the IHS, facilitate touch-use of edges of the IHS display adjacent the bezel, etc. For example, FIG. 6 is a partially fragmented diagrammatic isometric view of bezel 600 for a foldable IHS display resulting from machining of inner perimeter chamfers 602, for example, into bezel 500 of FIG. 5, according to some embodiments.

Figure 7:
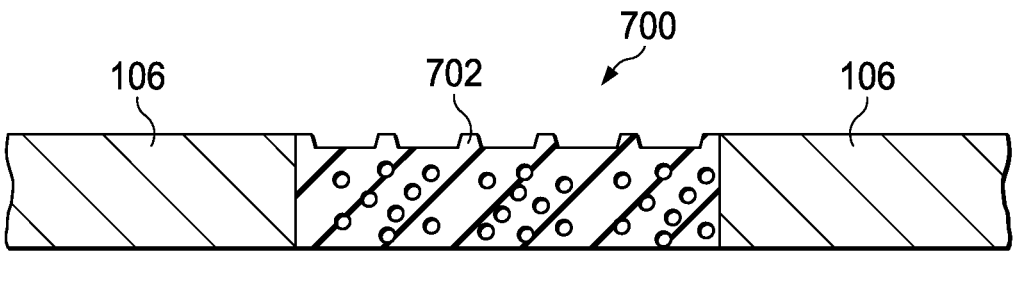
FIG. 7 is a fragmented diagrammatic side view of an elastomer strip, such as may be used in accordance with some embodiments of the present systems and methods.

FIG. 7 is a fragmented diagrammatic view of elastomer strip 700 such as may be used in accordance with some embodiments of the present systems and methods. FIG. 7 may be viewed as a side (generally cross-sectional view) of elastomer strip 110 or 112 of bezel 100, or the like, such as provided in FIG. 5 by die cut elastomer strip 308. Elastomer strip 700 may, in accordance with various embodiments of the present systems and methods, have fine texture 702 defined in a top surface of the elastomer strip, which allows for bending in the proper orientation during folding of the bezeled IHS display, while avoiding application of stress to the polycarbonate bezel frame and minimizing stress induced onto the panel. This may, in accordance with such embodiments, avoid raising up of the polycarbonate bezel frame elements and/or reverse bending of the elastomer strip itself.

Figure 8:
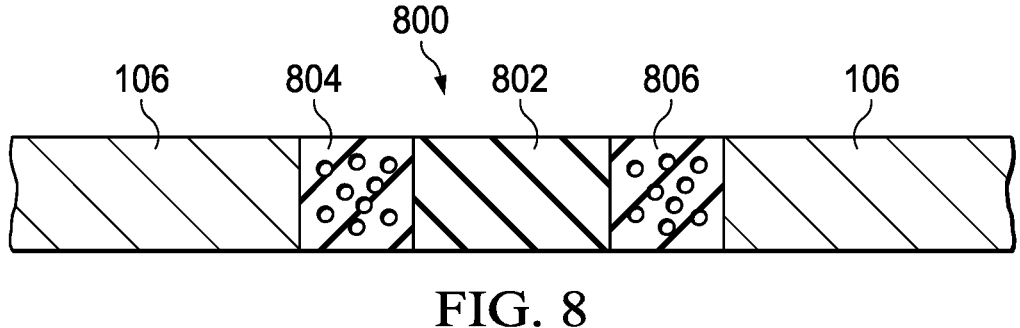
FIG. 8 is a fragmented diagrammatic side view of another elastomer strip, such as may be used in accordance with some embodiments of the present systems and methods.

FIG. 8 is a fragmented diagrammatic view of elastomer strip 800 such as may be used in accordance with some (other) embodiments of the present systems and methods. FIG. 8 may be viewed as a side (generally cross-sectional view) of elastomer strip 110 or 112 of bezel 100, or the like, such as provided in FIG. 5 by die cut elastomer strip 308. In such further embodiments elastomer strip 800 may be a composite elastomer strip which has central strip 802 of a higher durometer (e.g., relatively rigid, but still flexible) elastomer, such as, "solid" silicon foam and strips 804 and 806 of lower durometer (e.g., relatively flexible) elastomer (silicon) foam on either side of central strip 802. When disposed between edges 310 and 312 of each of each of polycarbonate sheets 304 and 306, as described above, central strip 802 of higher durometer elastomer will further reduce the stress to the polycarbonate bezel frame to achieve desired folding during use of the IHS mounting the foldable IHS display. This may also avoid raising up of the polycarbonate bezel frame elements and/or reverse bending of the low durometer foam itself. Central strip 802 may also, in some embodiments, have a have fine texture, such as fine texture 702 described above, defined in a top surface of elastomer strip 802. This top surface texture may further facilitate bending in the proper orientation during folding of the bezeled IHS display, while avoiding application of stress to the polycarbonate bezel frame. This may also, further avoid raising up of the polycarbonate bezel frame elements and/or reverse bending of the low durometer foam itself.

Figure 9:
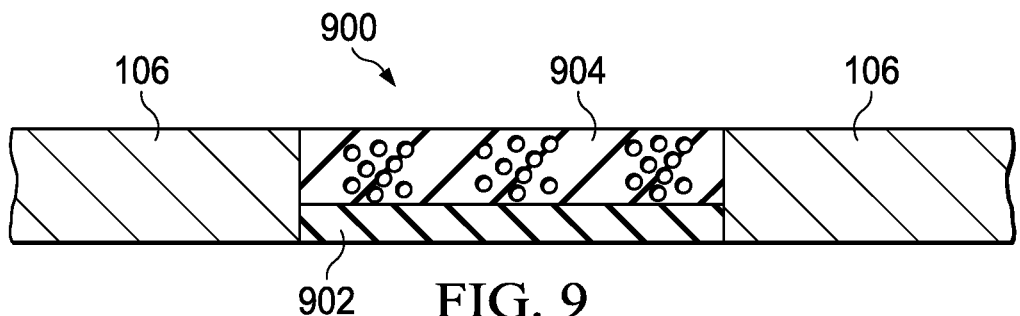
FIG. 9 is a fragmented diagrammatic side view of a further elastomer strip, such as may be used in accordance with some embodiments of the present systems and methods.

FIG. 9 is a fragmented diagrammatic view of elastomer strip 900 such as may be used in accordance with some (further) embodiments of the present systems and methods. FIG. 9 may be viewed as a side (generally cross-sectional view) of elastomer strip 110 or 112 of bezel 100, or the like, such as provided in FIG. 5 by die cut elastomer strip 308. In such other embodiments elastomer strip 900 may be a composite elastomer strip which has bottom strip 902 of a higher durometer (e.g., relatively rigid, but still flexible) elastomer, such as, "solid" silicon and top strip 904 of lower durometer (e.g., relatively flexible) elastomer (silicon) foam on top of bottom strip 902. When disposed between edges 310 and 312 of each of each of polycarbonate sheets 304 and 306, as described above, bottom strip 902 of higher durometer elastomer will reduce the stress to the polycarbonate bezel frame to achieve desired folding during use of the IHS mounting the foldable IHS display. This arrangement of higher and lower durometer elastomer may facilitate bending in the proper orientation during folding of the bezeled IHS display, while avoiding application of stress to the polycarbonate bezel frame. This may avoid raising up of the polycarbonate bezel frame elements and/or reverse bending of the low durometer foam itself.

Some other embodiments of the present systems and methods are directed to a multi-layer (polyurethane) dome bezel, and the like. That is, in accordance with other embodiments of the present systems and methods, an IHS flexible display bezel may be provided by disposing a polyurethane upper layer on the polycarbonate rectangular frame layer and adhering the die cut low durometer foam layer on a side of the polycarbonate rectangular frame layer opposite the polyurethane upper layer.

Figure 10:
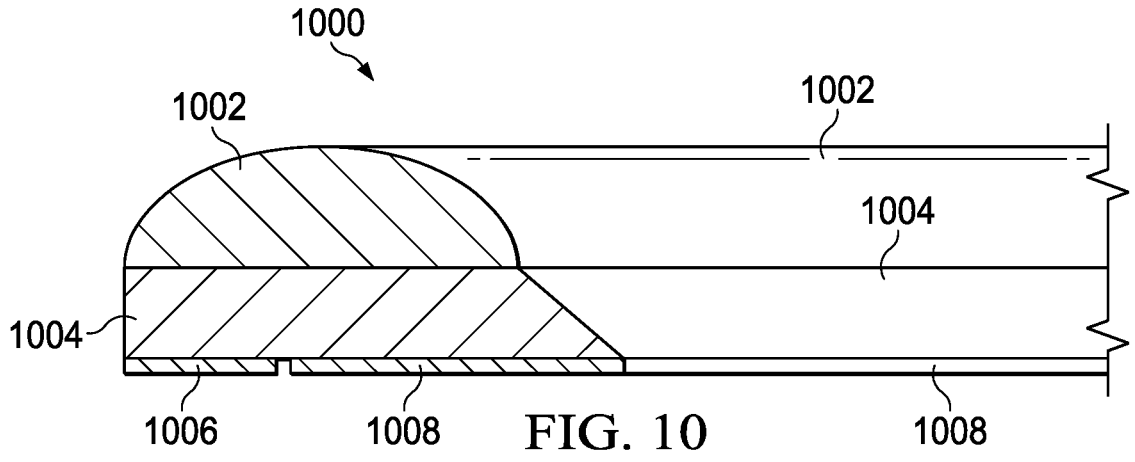
FIG. 10 is an enlarged partially fragmented, generally cross-sectional, side view of a multi-layer dome bezel for a foldable IHS display, according to some embodiments.
Figures 11, 12, 13:
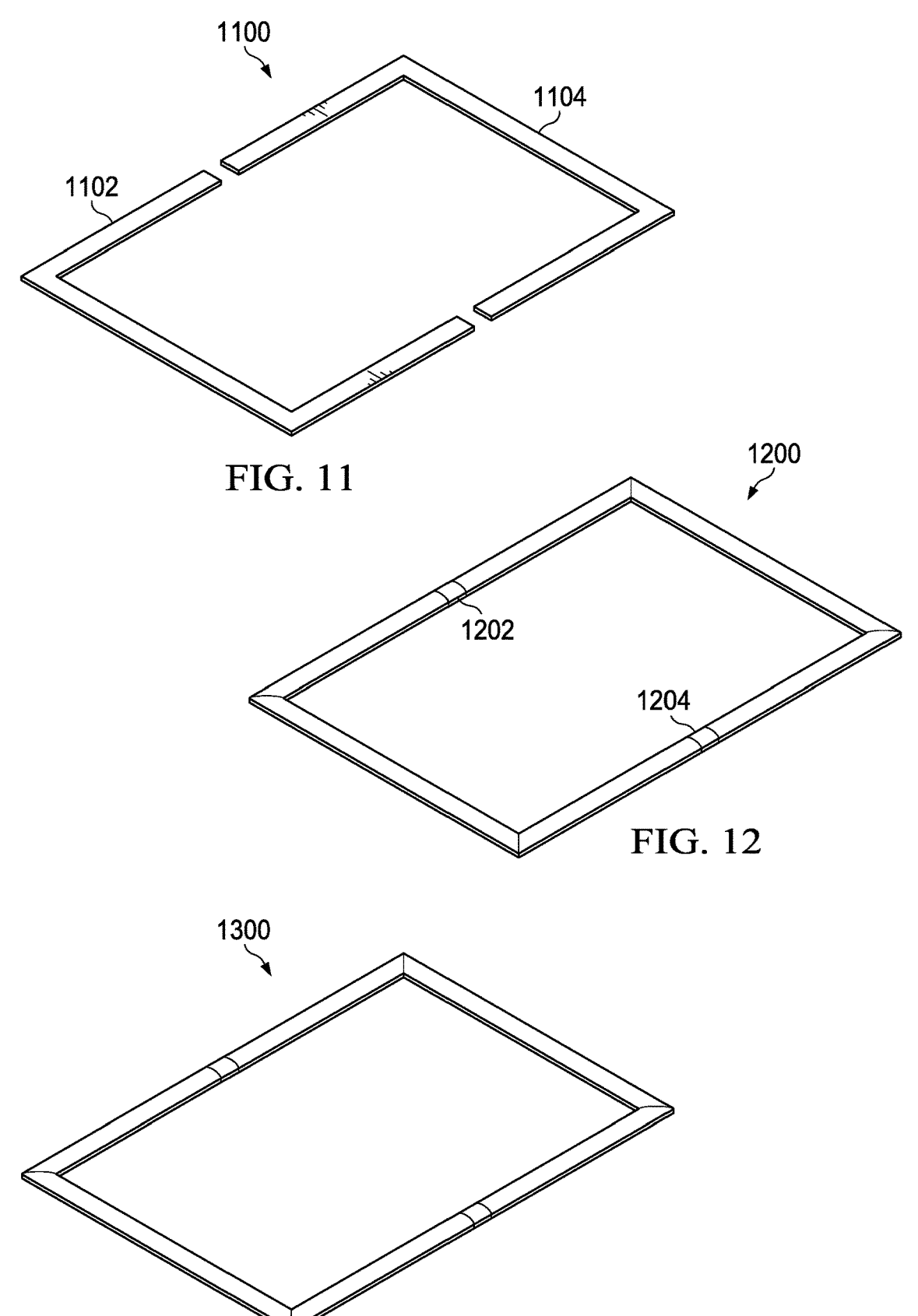
FIG. 11 is an isometric view of rectilinear rectangular polycarbonate frame halves for a for a foldable display bezel, according to some embodiments.
FIG. 12 shows such a domed bezel for a foldable IHS display, according to some embodiments.
FIG. 13 shows a full dome bezel for a foldable IHS display, according to some embodiments.

FIG. 10 is a partially fragmented, generally cross-sectional, side view of multi-layer dome bezel 1000 for a foldable IHS display, according to some embodiments. Therein, polymer upper layer 1002, such as a transparent Polyurethane (PU) upper layer, is disposed over transparent polycarbonate film substrate 1004, with pressure sensitive adhesive (PSA) border 1006 and low durometer foam (such as PORON®) 1008 disposed beneath. PSA 1006 and polyurethane foam 1008 may be applied to the underside of PC film 1004 for purposes of IHS integration and ingress protection. To form multi-layer dome bezel 1000 liquid PU is dispensed onto the transparent PC film bezel frame halves 1102 and 1104 of FIG. 11, which is an isometric view of such rectilinear rectangular PC frame halves for a for a foldable display bezel, according to some embodiments of the present systems and methods. Thereby, such bezel embodiments may comprise polymer layer 1002 aligned with polycarbonate (rectilinear) rectangular frame layer 1004/1102 and 1104 disposed on the polycarbonate (rectilinear) rectangular frame layer, on a side of the polycarbonate (rectilinear) rectangular frame layer opposite the die cut low durometer foam/PSA layer aligned with the polycarbonate (rectilinear) rectangular frame layer. In accordance with such embodiments of the present systems and methods, surface tension of the liquid PU produces a domed (rounded corner) cross section improving aesthetics of the resulting bezel. As with other embodiments, the PC film (frame) may be back printed with sensor openings for Camera, ALS, LEDs, etc. Holes may be defined in the PC film frame, such a microphone or other openings and the liquid PU can be dispensed around these areas while still maintaining a continuous cross section. In some implementations, as the PU liquid is dispensed, its surface tension prevents the PU from filling the openings creating a domed cross-section throughout, maintaining the PC frame openings through the PU dome layer. Also, in such embodiments, the PU stiffness is low enough to allow for bending in the fold region of the IHS foldable display device in a full dome construction design. FIG. 13 shows such a full dome construction bezel (1300) for a foldable IHS display, according to some embodiments, while FIG. 12 shows dome bezel 1200 where the PU capped PC film bezel frame halves are separated by flexible parts (such as rubber foam pieces) 1202 and 1204 attached between edges of the two bezel pieces 1102 and 1104 in the fold region of the IHS to improve folding performance.

Figure 14:
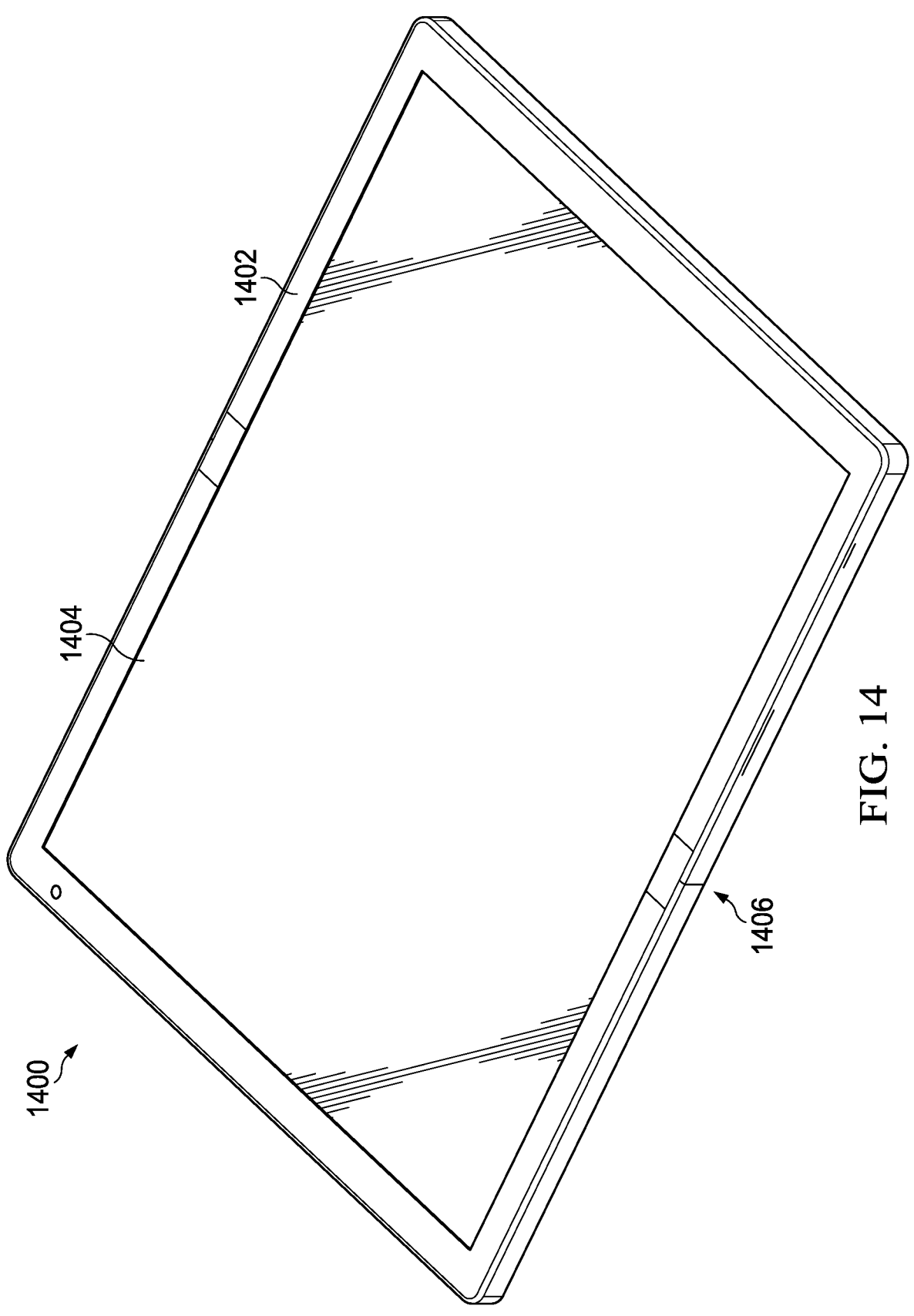
FIG. 14 is an isometric view of an IHS implementing a multi-layer bezel, according to some embodiments.

FIG. 14 is an isometric view of IHS 1400 implementing multi-layer bezel 1402, according to some embodiments, specifically, IHS 1400 with foldable display 1404 and folding axis 1406 implementing multi-layer bezel 1402.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 15:
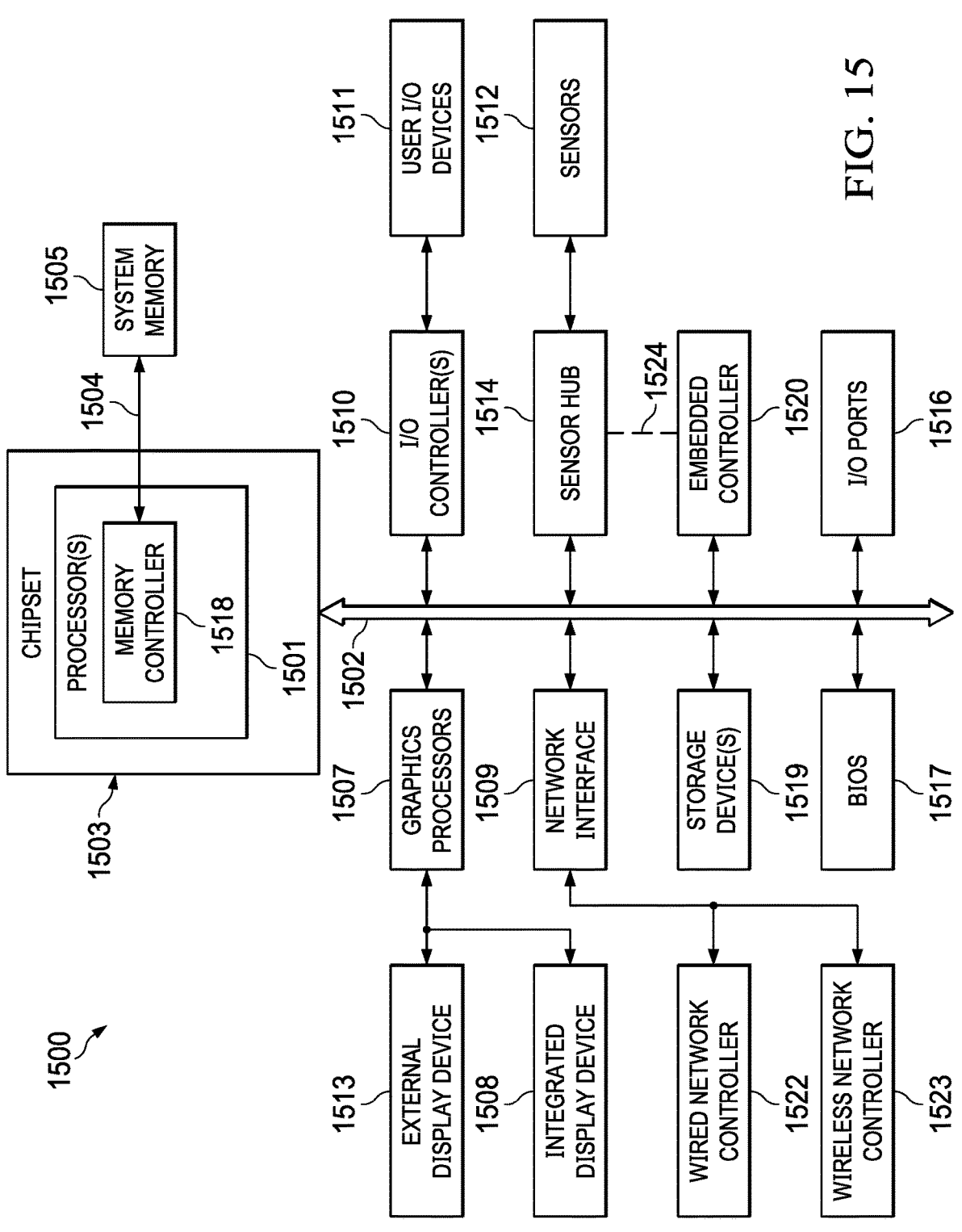
FIG. 15 is a block diagram of an example of internal components of an IHS, according to some embodiments.

FIG. 15 is a block diagram of an example of internal components of IHS 1500, according to some embodiments. As shown, IHS 1500 includes one or more processors 1501, such as a Central Processing Unit (CPU), that execute code retrieved from system memory 1505.

Although IHS 1500 is illustrated with a single processor 1501, other embodiments may include two or more processors, that may each be configured identically, or to provide specialized processing operations. Processor(s) 1501 may include any processor capable of executing instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 15, processor(s) 1501 includes an integrated memory controller 1518 that may be implemented directly within the circuitry of processor(s) 1501, or memory controller 1518 may be a separate integrated circuit that is located on the same die as processor(s) 1501. Memory controller 1518 may be configured to manage the transfer of data to and from the system memory 1505 of IHS 1500 via high-speed memory interface 1504. System memory 1505 coupled to processor(s) 1501 provides processor(s) 1501 with a high-speed memory that may be used in the execution of computer program instructions by processor(s) 1501.

Accordingly, system memory 1505 may include memory components, such as static RAM (SRAM), dynamic RAM (DRAM), NAND Flash memory, suitable for supporting high-speed memory operations by processor(s) 1501. In certain embodiments, system memory 1505 may combine both persistent, non-volatile memory and volatile memory. In certain embodiments, system memory 1505 may include multiple removable memory modules.

IHS 1500 utilizes chipset 1503 that may include one or more integrated circuits that are connected to processor(s) 1501. In the embodiment of FIG. 15, processor(s) 1501 is depicted as a component of chipset 1503. In other embodiments, all of chipset 1503, or portions of chipset 1503 may be implemented directly within the integrated circuitry of processor(s) 1501. Chipset 1503 provides processor(s) 1501 with access to a variety of resources accessible via bus 1502.

In IHS 1500, bus 1502 is illustrated as a single element. Various embodiments may utilize any number of separate buses to provide the illustrated pathways served by bus 1502.

In various embodiments, IHS 1500 may include one or more I/O ports 1516 that may support removeable couplings with various types of external devices and systems, including removeable couplings with peripheral devices that may be configured for operation by a particular user of IHS 1500. For instance, I/O 1516 ports may include USB (Universal Serial Bus) ports, by which a variety of external devices may be coupled to IHS 1500. In addition to or instead of USB ports, I/O ports 1516 may include various types of physical I/O ports that are accessible to a user via the enclosure of IHS 1500.

In certain embodiments, chipset 1503 may additionally utilize one or more I/O controllers 1510 that may each support the operation of hardware components such as user I/O devices 1511 that may include peripheral components physically coupled to I/O port 1516 and/or peripheral components that are wirelessly coupled to IHS 1500 via network interface 1509.

In various implementations, I/O controller 1510 may support the operation of one or more user I/O devices 1510 such as a keyboard, mouse, touchpad, touchscreen, microphone, speakers, camera and other input and output devices that may be coupled to IHS 1500. User I/O devices 1511 may interface with an I/O controller 1510 through wired or wireless couplings supported by IHS 1500. In some cases, I/O controllers 1510 may support configurable operation of supported peripheral devices, such as user I/O devices 1511.

As illustrated, a variety of additional resources may be coupled to processor(s) 1501 of IHS 1500 through chipset 1503. For instance, chipset 1503 may be coupled to network interface 1509 that may support different types of network connectivity. IHS 1500 may also include one or more Network Interface Controllers (NICs) 1522 and 1523, each of which may implement the hardware required for communicating via a specific networking technology, such as Wi-Fi, BLUETOOTH, Ethernet and mobile cellular networks (e.g., CDMA, TDMA, LTE).

Network interface 1509 may support network connections by wired network controllers 1522 and wireless network controllers 1523. Each network controller 1522 and 1523 may be coupled via various buses to chipset 1503 to support different types of network connectivity, such as the network connectivity utilized by IHS 1500.

As illustrated, IHS 1500 may support integrated display device 1508, such as a display integrated into a laptop, tablet, 2-in-1 convertible device, or mobile device. IHS 1500 may also support use of one or more external displays 1513, such as external monitors that may be coupled to IHS 1500 via various types of couplings, such as by connecting a cable from the external display 1513 to external I/O port 1516 of the IHS 1500.

One or more display devices 1508 and/or 1513 coupled to IHS 1500 may utilize LCD, LED, OLED, or other foldable and/or flexible display technologies. Each display device 1508 and 1513 may be capable of receiving touch inputs such as via a touch controller that may be an embedded component of display device 1508 and/or 1513 or graphics processor 1507, or it may be a separate component of IHS 1500 accessed via bus 1502. In some cases, power to graphics processor 1507, integrated display device 1508 and/or external display 1513 may be turned off or configured to operate at minimal power levels in response to IHS 1500 entering a low-power state (e.g., standby).

In certain scenarios, the operation of integrated displays 1508 and external displays 1513 may be configured for a particular user. For instance, a particular user may prefer specific brightness settings that may vary the display brightness based on time of day and ambient lighting conditions.

As such, chipset 1503 may provide access to one or more display device(s) 1508 and/or 1513 via graphics processor 1507. Graphics processor 1507 may be included within a video card, graphics card or within an embedded controller installed within IHS 1500. Additionally, or alternatively, graphics processor 1507 may be integrated within processor(s) 1501, such as a component of a system-on-chip (SoC). Graphics processor 1507 may generate display information and provide the generated information to one or more display device(s) 1508 and/or 1513, coupled to IHS 1500.

Chipset 1503 also provides processor(s) 1501 with access to one or more storage devices 1519. In various embodiments, storage device 1519 may be integral to IHS 1500 or may be external to IHS 1500. In certain embodiments, storage device 1519 may be accessed via a storage controller that may be an integrated component of the storage device. Storage device 1519 may be implemented using any memory technology allowing IHS 1500 to store and retrieve data.

For instance, storage device 1519 may be a magnetic hard disk storage drive or a solid-state storage drive. In certain embodiments, storage device 1519 may be a system of storage devices, such as a cloud system or enterprise data management system that is accessible via network interface 1509.

As illustrated, IHS 1500 also includes Basic Input/Output System (BIOS) 1517 that may be stored in a non-volatile memory accessible by chipset 1503 via bus 1502. Upon powering or restarting IHS 1500, processor(s) 1501 may utilize BIOS 1517 instructions to initialize and test hardware components coupled to the IHS 1500. BIOS 1517 instructions may also load an operating system (OS) (e.g., WINDOWS, MACOS, iOS, ANDROID, LINUX, etc.) for use by IHS 1500.

BIOS 1517 provides an abstraction layer that allows the operating system to interface with the hardware components of the IHS 1500. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

As illustrated, certain IHS 1500 embodiments may utilize sensor hub 1514 capable of sampling and/or collecting data from a variety of hardware sensors 1512. For instance, sensors 1512, may be disposed within IHS 1500, and/or display 1508, and/or a hinge coupling a display portion to a keyboard portion of IHS 1500, and may include, but are not limited to: electric, magnetic, hall effect, radio, optical, infrared, thermal, force, pressure, touch, acoustic, ultrasonic, proximity, position, location, angle, deformation, bending, direction, movement, velocity, rotation, acceleration, bag state (in or out of a bag), and/or lid sensor(s) (open or closed).

In some cases, one or more sensors 1512 may be part of a keyboard or other input device. Processor 1501 may be configured to process information received from sensors 1512 through sensor hub 1514.

For instance, during operation of IHS 1500, the user may open, close, flip, swivel, or rotate display 1508 to produce different IHS postures. In some cases, processor 1501 may be configured to determine a current posture of IHS 1500 using sensors 1512 (e.g., a lid sensor, a hinge sensor, etc.). For example, in a dual-display IHS implementation, when a first display 1508 (in a first IHS portion) is folded against a second display 1508 (in a second IHS portion) so that the two displays have their backs against each other, IHS 1500 may be said to have assumed a book posture. Other postures may include a table posture, a display posture, a laptop posture, a stand posture, or a tent posture, depending upon whether IHS 1500 is stationary, moving, horizontal, resting at a different angle, and/or its orientation (landscape vs. portrait).

For instance, in a laptop posture, a first display surface of a first display 1508 may be facing the user at an obtuse angle with respect to a second display surface of a second display 1508 or a physical keyboard portion. In a tablet posture, a first display 1508 may be at a straight angle with respect to a second display 1508 or a physical keyboard portion. And, in a book posture, a first display 1508 may have its back resting against the back of a second display 1508 or a physical keyboard portion.

It should be noted that the aforementioned postures, and their various respective keyboard states, are described for sake of illustration. In different embodiments, other postures may be used, for example, depending upon the type of hinge coupling the displays, the number of displays used, or other accessories.

In other cases, processor(s) 1501 may process user presence data received by sensors 1512 and may determine, for example, whether an IHS's end-user is present or absent. Moreover, in situations where the end-user is present before IHS 1500, processor(s) 1501 may further determine a distance of the end-user from IHS 1500 continuously or at pre-determined time intervals. The detected or calculated distances may be used by processor(s) 1501 to classify the user as being in the IHS's near-field (user's position <threshold distance A), mid-field (threshold distance A<user's position <threshold distance B, where B >A), or far-field (user's position >threshold distance C, where C>B) with respect to IHS 1500 and/or display 1508.

More generally, in various implementations, processor 1501 may receive and/or produce context information using sensors 1512 including one or more of, for example: a user's presence state (e.g., present, near-field, mid-field, far-field, absent), a facial expression of the user, a direction of the user's gaze, a user's gesture, a user's voice, an IHS location (e.g., based on the location of a wireless access point or Global Positioning System), IHS movement (e.g., from an accelerometer or gyroscopic sensor), lid state (e.g., of a laptop), hinge angle (e.g., in degrees), IHS posture (e.g., laptop, tablet, book, tent, and display), whether the IHS is coupled to a dock or docking station, a distance between the user and at least one of: the IHS, the keyboard, or a display coupled to the IHS, a type of keyboard (e.g., a physical keyboard integrated into IHS 1500, a physical keyboard external to IHS 1500, or an on-screen keyboard), whether the user operating the keyboard is typing with one or two hands (e.g., holding a stylus, or the like), a time of day, software application(s) under execution in focus for receiving keyboard input, whether IHS 1500 is inside or outside of a carrying bag, ambient lighting, a battery charge level, whether IHS 1500 is operating from battery power or is plugged into an AC power source (e.g., whether the IHS is operating in AC-only mode, DC-only mode, or AC+DC mode), a power consumption of various components of IHS 1500 (e.g., CPU 1501, GPU 1507, system memory 1505, etc.).

In certain embodiments, sensor hub 1514 may be an independent microcontroller or other logic unit that is coupled to the motherboard of IHS 1500. Sensor hub 1514 may be a component of an integrated system-on-chip incorporated into processor 1501, and it may communicate with chipset 1503 via a bus connection such as an Inter-Integrated Circuit ($I^2C$) bus or other suitable type of bus connection. Sensor hub 1514 may also utilize an $I^2C$ bus for communicating with various sensors supported by IHS 1500.

As illustrated, IHS 1500 may utilize embedded controller (EC) 1520, which may be a motherboard component of IHS 1500 and may include one or more logic units. In certain embodiments, EC 1520 may operate from a separate power plane from the main processors 1501 and thus the OS operations of IHS 1500. Firmware instructions utilized by EC 1520 may be used to operate a secure execution system that may include operations for providing various core functions of IHS 1500, such as power management, management of operating modes in which IHS 1500 may be physically configured and support for certain integrated I/O functions. In some embodiments, EC 1520 and sensor hub 1514 may communicate via an out-of-band signaling pathway or bus 1524.

In various embodiments, IHS 1500 may not include each of the components shown in FIG. 15. Additionally, or alternatively, IHS 1500 may include various additional components in addition to those that are shown in FIG. 15. Furthermore, some components that are represented as separate components in FIG. 15 may in certain embodiments instead be integrated with other components. For example, in certain embodiments, all or a portion of the functionality provided by the illustrated components may instead be provided by components integrated into the one or more processor(s) 1501 as an SoC.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A multi-layer bezel for a flexible information handling system (IHS) display comprising:

a polycarbonate rectangular frame layer comprising two thin transparent polycarbonate sheets and at least one elastomer strip disposed between adjacent edges of the polycarbonate sheets, wherein the frame layer is folded along the at least one elastomer strip;

a polymer layer aligned with the polycarbonate rectangular frame layer, wherein the polymer layer is disposed beneath the frame layer and adhered to the polycarbonate sheets and to the at least one elastomer strip of the frame layer; and a die-cut foam layer, aligned with and disposed below the polymer layer and sealing the bezel to a panel of the display.

2. The bezel of claim 1, wherein the polycarbonate rectangular frame layer comprises a first open-sided rectangular frame segment and a complementary second open-sided rectangular frame segment.

3. The bezel of claim 1, wherein the polycarbonate rectangular frame is transparent and back-printed with sensor openings for IHS components.

4. The bezel of claim 3, wherein the IHS components comprise one or more of a camera, ambient light sensor, light emitting diode infrared/facial recognition camera, microphone, and hall sensor.

5. The bezel of claim 1, wherein the transparent polycarbonate sheets provide structural rigidity to the bezel.

6. The bezel of claim 1, wherein the transparent polycarbonate sheets are back-printed.

7. The bezel of claim 1, wherein the at least one elastomer strip comprises a synthetic rubber strip.

8. The bezel of claim 1, wherein the at least one elastomer strip comprises a silicone foam rubber strip.

9. The bezel of claim 1, wherein the at least one elastomer strip comprises a texture that promotes the folding of the frame layer and that is disposed on a top surface of the elastomer strip.

10. The bezel of claim 1, wherein the at least one elastomer strip comprises a composite elastomer strip comprising a central strip of higher durometer rigid elastomer and strips of lower durometer elastomer foam on either side of the central strip of higher durometer rigid elastomer disposed between an edge of each of the polycarbonate sheets and the central strip of higher durometer rigid elastomer.

11. The bezel of claim 1, wherein the foam layer comprises an inner polyurethane foam sheet and an outer pressure sensitive adhesive border.

12. The bezel of claim 1, further comprising machine finished chamfers along inner and outer perimeters of the bezel.

13. The bezel of claim 1, wherein the polymer layer aligned with the polycarbonate rectangular frame layer comprises a polyurethane upper layer disposed on the polycarbonate rectangular frame layer on a side of the polycarbonate rectangular frame layer opposite the die-cut foam layer.

14. An Information Handling System (IHS), comprising:
a flexible display; and
a multi-layer bezel adhered to the flexible display comprising:
a polycarbonate rectangular frame layer comprising two thin transparent polycarbonate sheets and at least one elastomer strip disposed between adjacent edges of the polycarbonate sheets, wherein the frame layer is folded along the at least one elastomer strip;
a polymer layer aligned with the polycarbonate rectangular frame layer, wherein the polymer layer is disposed beneath the frame layer and adhered to the polycarbonate sheets and to the at least one elastomer strip of the frame layer; and
a die-cut foam layer, aligned with and disposed below the polymer layer and sealing the bezel to a panel of the display.

15. The IHS of claim 14, wherein the polymer layer aligned with the polycarbonate rectangular frame layer comprises a polyurethane upper layer disposed on the polycarbonate rectangular frame layer on a side of the polycarbonate rectangular frame layer opposite the die-cut foam layer.

16. A foldable computer display comprising:
a polycarbonate rectangular frame layer comprising two thin transparent polycarbonate sheets and at least one elastomer strip disposed between adjacent edges of the polycarbonate sheets, wherein the frame layer is folded along the at least one elastomer strip;
a polymer layer aligned with the polycarbonate rectangular frame layer, wherein the polymer layer is disposed beneath the frame layer and adhered to the polycarbonate sheets and to the at least one elastomer strip of the frame layer; and
a die-cut foam layer, aligned with and disposed below the polymer layer and sealed to a panel of the display.

17. The foldable computer display of claim 16, wherein the at least one elastomer strip comprises a composite elastomer strip comprising a central strip of higher durometer rigid elastomer and strips of lower durometer elastomer foam on either side of the central strip of higher durometer rigid elastomer disposed between an edge of each of the polycarbonate sheets and the central strip of higher durometer rigid elastomer.

* * * * *